(12) United States Patent
Chen

(10) Patent No.: US 10,714,504 B2
(45) Date of Patent: Jul. 14, 2020

(54) LOW TEMPERATURE POLY-SILICON THIN FILM TRANSISTOR ARRAY SUBSTRATE AND METHOD OF PRODUCING THE SAME

(71) Applicant: Wuhan China Star Optoelectronics Technology Co., Ltd., Wuhan (CN)

(72) Inventor: Chen Chen, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/308,824

(22) PCT Filed: Nov. 20, 2018

(86) PCT No.: PCT/CN2018/116302
§ 371 (c)(1),
(2) Date: Dec. 11, 2018

(87) PCT Pub. No.: WO2020/042383
PCT Pub. Date: Mar. 5, 2020

(65) Prior Publication Data
US 2020/0111818 A1     Apr. 9, 2020

(30) Foreign Application Priority Data

Aug. 29, 2018   (CN) .......................... 2018 1 0995637

(51) Int. Cl.
*H01L 27/12* (2006.01)
*H01L 21/84* (2006.01)

(52) U.S. Cl.
CPC ........ *H01L 27/1237* (2013.01); *H01L 27/124* (2013.01); *H01L 27/1248* (2013.01); *H01L 27/1288* (2013.01)

(58) Field of Classification Search
CPC ............... H01L 27/1237; H01L 27/124; H01L 27/1248; H01L 27/1288; H01L 21/84
See application file for complete search history.

(56) References Cited

U.S. PATENT DOCUMENTS

| 10,249,654 B1 | 4/2019 | Zhou et al. |
| 10,367,073 B2 * | 7/2019 | Liu ........................ H01L 21/266 |

(Continued)

FOREIGN PATENT DOCUMENTS

| CN | 104637955 | 5/2015 |
| CN | 106847744 | 6/2017 |
| CN | 107946368 | 4/2018 |

*Primary Examiner* — Christine A Enad

(57) ABSTRACT

The present disclosure proposes a method of producing an LTPS TFT array substrate. The method is about stacking of a gate insulating layer and an interlayer insulating layer for providing conditions for formation of a gate trench. In addition, stacking of the gate insulating layer and the interlayer insulating layer is produced with some blocks of forming a hole on the gate insulating layer and the interlayer insulating layer to form a hole pattern, filling the gate trench, and producing gate lines. In this way, the formation of the gate lines and the formation of the hole pattern on the gate insulating layer and the interlayer insulating layer are done using the same mask. The method of the present disclosure reduces the number of masks required compared with the method of the related art, thereby reducing the production costs.

10 Claims, 5 Drawing Sheets

(56) References Cited

U.S. PATENT DOCUMENTS

| | | | |
|---|---|---|---|
| 2009/0152560 A1* | 6/2009 | Yagi | G02F 1/133707 |
| | | | 257/72 |
| 2017/0155002 A1 | 6/2017 | Zhou et al. | |
| 2017/0186878 A1* | 6/2017 | Xiao | G03F 1/22 |
| 2019/0074305 A1* | 3/2019 | Gong | H01L 29/78684 |

* cited by examiner

LOW TEMPERATURE POLY-SILICON THIN FILM TRANSISTOR ARRAY SUBSTRATE AND METHOD OF PRODUCING THE SAME

RELATED APPLICATIONS

This application is a National Phase of PCT Patent Application No. PCT/CN2018/116302 having International filing date of Nov. 20, 2018, which claims the benefit of priority of Chinese Patent Application No. 201810995637.7 filed on Aug. 29, 2018. The contents of the above applications are all incorporated by reference as if fully set forth herein in their entirety.

FIELD AND BACKGROUND OF THE INVENTION

The present disclosure relates to display technology, and more particularly, to a low temperature poly-silicon (LTPS) thin film transistor (TFT) array substrate and a method of producing the LTPS TFT array substrate.

In the manufacturing field of display screens, the low temperature poly-silicon (LTPS) technology is increasingly favored by manufacturers of cellphones, flat screens, and so on owing to the features of the LTPS technology such as low production costs and high electron mobility.

In the LTPS technology of the related art, a lot of films with a complex film structure are necessary so a lot of exposure with a lot of masks is required in the LTPS process. FIG. 1 illustrates the structure of a TFT film formed using the LTPS technology of the related art. The structure of the TFT film includes a glass substrate 100, a light shielding layer 101, a buffer layer 102, a poly-silicon layer 103, a gate insulating layer 104, a gate line 105, an interlayer insulating layer 106, a source electrode 108, and a drain electrode 109. The light shielding layer 101 is disposed on the glass substrate 100. The buffer layer 102 is disposed on the glass substrate 100 and the light shielding layer 101. The poly-silicon layer 103 is disposed on the buffer layer 102. The gate insulating layer 104 is disposed on the poly-silicon layer 103 and the buffer layer 102. The gate line 105 is disposed on the gate insulating layer 104. The interlayer insulating layer 106 is disposed on the gate line 105 and the gate insulating layer 104. The source electrode 108 is disposed on the interlayer insulating layer 106 and connected to the poly-silicon layer 103 through a source hole. The drain electrode 109 is disposed on the interlayer insulating layer 106 and connected to the poly-silicon layer 103 through a drain hole. FIG. 2 is a flowchart of the main process of forming the TFT film structure as illustrated in FIG. 1. According to this flowchart, it is necessary to use six or more masks to fabricate the TFT film structure as illustrated in FIG. 1. In order to solve the problem that the production costs are a little high due to too many masks used in the manufacturing process of the LTPS TFT device, major manufacturers are seeking ways to reduce the number of masks intended to be used in the manufacturing process.

SUMMARY OF THE INVENTION

In view of the above-mentioned problem, a method of producing a low temperature poly-silicon (LTPS) thin film transistor (TFT) array substrate is proposed by the present disclosure for the purpose of reducing the use of masks configured in the LTPS TFT array substrate in numbers, thereby lowering the production costs.

According to a first aspect of the present disclosure, a method of producing a low temperature poly-silicon (LTPS) thin film transistor (TFT) array substrate includes: forming a poly-silicon layer on a substrate; forming one or more gate insulating layers and one or more interlayer insulating layers sequentially on the poly-silicon layer; coating a first photoresist layer on the gate insulating layer or the interlayer insulating layer; processing the gate insulating layer and the interlayer insulating layer in an etching process to form source/drain holes and exposing the poly-silicon layer partially after the first photoresist layer is exposed by a mask and developed by a developing solution; forming a gate trench simultaneously on the gate insulating layer or the interlayer insulating layer; peeling off the first photoresist layer left on the gate insulating layer or the interlayer insulating layer; filling up the source/drain hole and the gate trench; forming a gate layer on the partially exposed poly-silicon layer, the gate insulating layer, or/and the interlayer insulating layer; coating a second photoresist layer on the gate layer; processing the gate layer in the etching process to form a gate line on the gate insulating layer or the interlayer insulating layer which corresponds to a lower region of the gate trench after the second photoresist layer is exposed by the mask and developed by the developing solution. The depth of the gate trench is less than the sum of the thickness of the gate insulating layer and the thickness of the interlayer insulating layer.

According to an embodiment of the present disclosure, the step of forming the one or more gate insulating layers and the one or more interlayer insulating layers sequentially on the poly-silicon layer comprises a block of forming the gate insulating layer and the interlayer insulating layer at once by chemical vapor deposition (CVD).

According to an embodiment of the present disclosure, the gate insulating layer is any one of a silicon nitride (SiNx) layer, a silicon oxide (SiOx) layer, and a composite layer of the SiOx layer and the SiNx layer; the interlayer insulating layer is any one of the SiNx layer, the SiOx layer, and the composite layer of the SiOx layer and the SiNx layer.

According to an embodiment of the present disclosure, the step of forming the one or more gate insulating layers and the one or more interlayer insulating layers sequentially on the poly-silicon layer comprises a block of forming a first gate insulating layer, a first interlayer insulating layer, a second gate insulating layer, and a second interlayer insulating layer sequentially on the poly-silicon layer; the first gate insulating layer and the first interlayer insulating layer are both the $SiO_x$ layers; the second gate insulating layer and the second interlayer insulating layer are the $SiN_x$ layers.

According to an embodiment of the present disclosure, the thickness of the gate line is the same as the depth of the gate trench.

According to an embodiment of the present disclosure, the gate trench is obtained after the gate insulating layer and the interlayer insulating layer are dealt with in a dry etching process or a wet etching process.

According to an embodiment of the present disclosure, the gate layer is made by one of materials consisting of molybdenum, aluminum, copper, and titanium.

According to an embodiment of the present disclosure, before the step of forming the poly-silicon layer on the substrate, the method of producing the LTPS TFT array substrate further comprises a block of forming a buffer layer on the substrate via a plasma-enhanced chemical vapor deposition (PECVD).

According to an embodiment of the present disclosure, before the step of forming the poly-silicon layer on the substrate, the method of producing the LTPS TFT array substrate further comprises a block of forming a light shielding layer on the substrate.

According to an embodiment of the present disclosure, the method of producing the LTPS TFT array substrate further comprises: forming a data line on a source electrode. The source electrode and the gate line are produced in the same process.

According to a second aspect of the present disclosure, a low temperature poly-silicon (LTPS) thin film transistor (TFT) array substrate includes a substrate, a poly-silicon layer formed on the substrate, one or more gate insulating layers and one or more interlayer insulating layers sequentially formed on the poly-silicon layer, a gate trench formed on the gate insulating layer or the interlayer insulating layer, a gate line on the gate insulating layer or the interlayer insulating layer which corresponds to a lower region of the gate trench. A depth of the gate trench is less than a sum of the thickness of the gate insulating layer and the thickness of the interlayer insulating layer.

According to an embodiment of the present disclosure, the gate insulating layer and the interlayer insulating layer are formed at once by chemical vapor deposition (CVD).

According to an embodiment of the present disclosure, the gate insulating layer is any one of a silicon nitride (SiNx) layer, a silicon oxide (SiOx) layer, and a composite layer of the SiOx layer and the SiNx layer; the interlayer insulating layer is any one of the SiNx layer, the SiOx layer, and the composite layer of the SiOx layer and the SiNx layer.

According to an embodiment of the present disclosure, a first gate insulating layer, a first interlayer insulating layer, a second gate insulating layer, and a second interlayer insulating layer are sequentially formed on the poly-silicon layer; the first gate insulating layer and the first interlayer insulating layer are both the $SiO_x$ layers; the second gate insulating layer and the second interlayer insulating layer are the $SiN_x$ layers.

According to an embodiment of the present disclosure, the thickness of the gate line is the same as the depth of the gate trench.

According to an embodiment of the present disclosure, the gate trench is obtained after the gate insulating layer and the interlayer insulating layer are dealt with in a dry etching process or a wet etching process.

According to an embodiment of the present disclosure, the gate layer is made by one of materials consisting of molybdenum, aluminum, copper, and titanium.

According to an embodiment of the present disclosure, the LTPS TFT array substrate further comprises a buffer layer sandwiched between the substrate and the poly-silicon layer.

According to an embodiment of the present disclosure, the LTPS TFT array substrate further comprises a light shielding layer sandwiched between the substrate and the poly-silicon layer.

According to an embodiment of the present disclosure, the LTPS TFT array substrate further comprises a data line on the source electrode. The source electrode and the gate line are produced by the same process.

Compared with the related art, the present disclosure brings some beneficial effects as follows.

The present disclosure proposes a method of producing an LTPS TFT array substrate. The method is about stacking of a gate insulating layer and an interlayer insulating layer for providing conditions for formation of a gate trench. In addition, stacking of the gate insulating layer and the interlayer insulating layer is produced with some blocks of forming a hole on the gate insulating layer and the interlayer insulating layer to form a hole pattern (source/drain holes and the gate trench), filling the gate trench, and producing gate lines. In this way, the formation of the gate lines and the formation of the hole pattern on the gate insulating layer and the interlayer insulating layer are done using the same mask. Compared with the manufacturing process of the related art, the manufacturing process of the LTPS TFT array substrate of the present disclosure omits one mask. That is to say, the method of producing the LTPS TFT array substrate of the present disclosure reduces the number of masks required compared with the method of the related art, thereby reducing the production costs.

BRIEF DESCRIPTION OF THE SEVERAL VIEWS OF THE DRAWINGS

In order to more clearly illustrate the embodiments of the present disclosure or related art, the following figures will be described in the embodiments are briefly introduced. It is obvious that the drawings are merely some embodiments of the present disclosure, those of ordinary skill in this field can obtain other figures according to these figures without paying the premise.

The elements labeled in the figures are shown as follows: 100, 200 glass substrate; 101, 201 light shielding layer; 102, 202 buffer layer; 103, 203 poly-silicon layer; 104, 204 gate insulating layer; 105, 205 gate line; 106, 206 interlayer insulating layer; 207 source/drain hole; 108, 208 source electrode; 109, 209 drain electrode; 210 gate layer; 211 gate trench; 212, 213, 214 photoresist layer; 215 data line layer; 216 data line

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
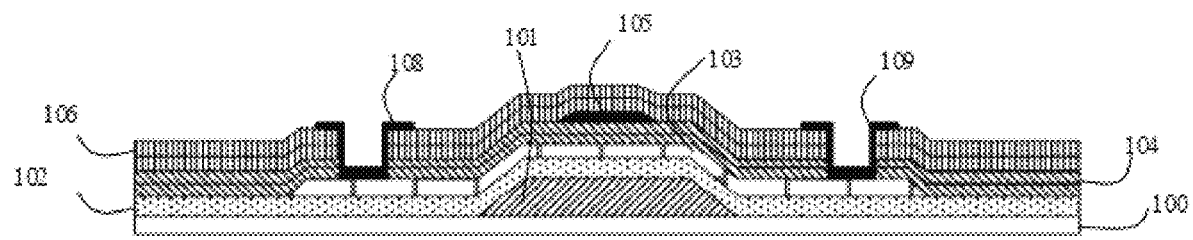
FIG. 1 illustrates the structure of a TFT film formed using the LTPS technology of the related art.
Figure 2:
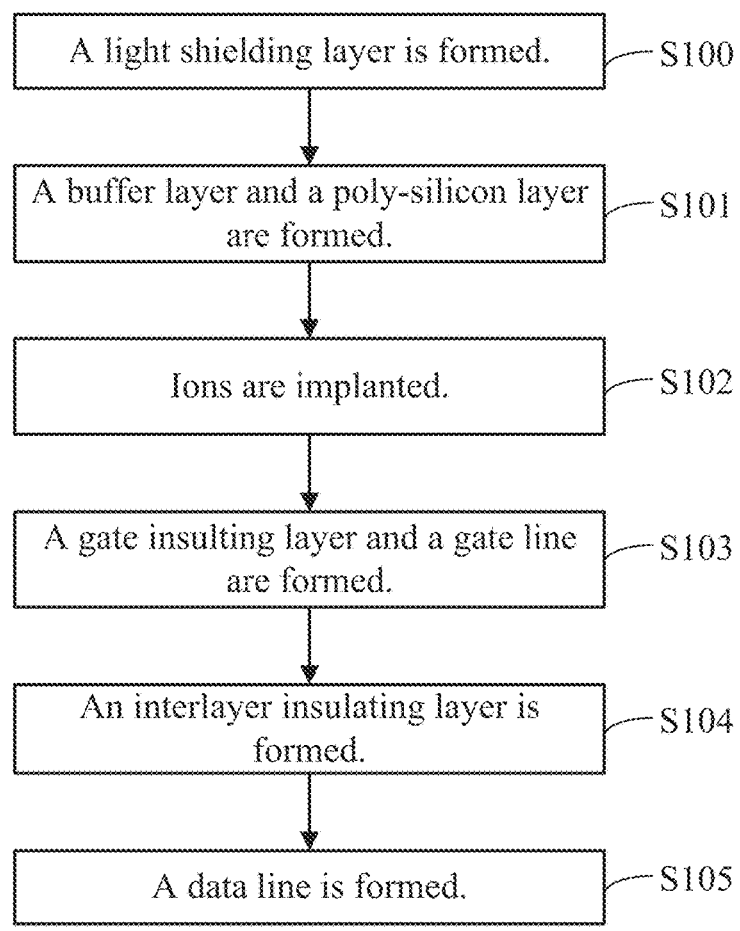
FIG. 2 is a flowchart of the main process of forming the TFT film structure as illustrated in FIG. 1.
Figure 3:
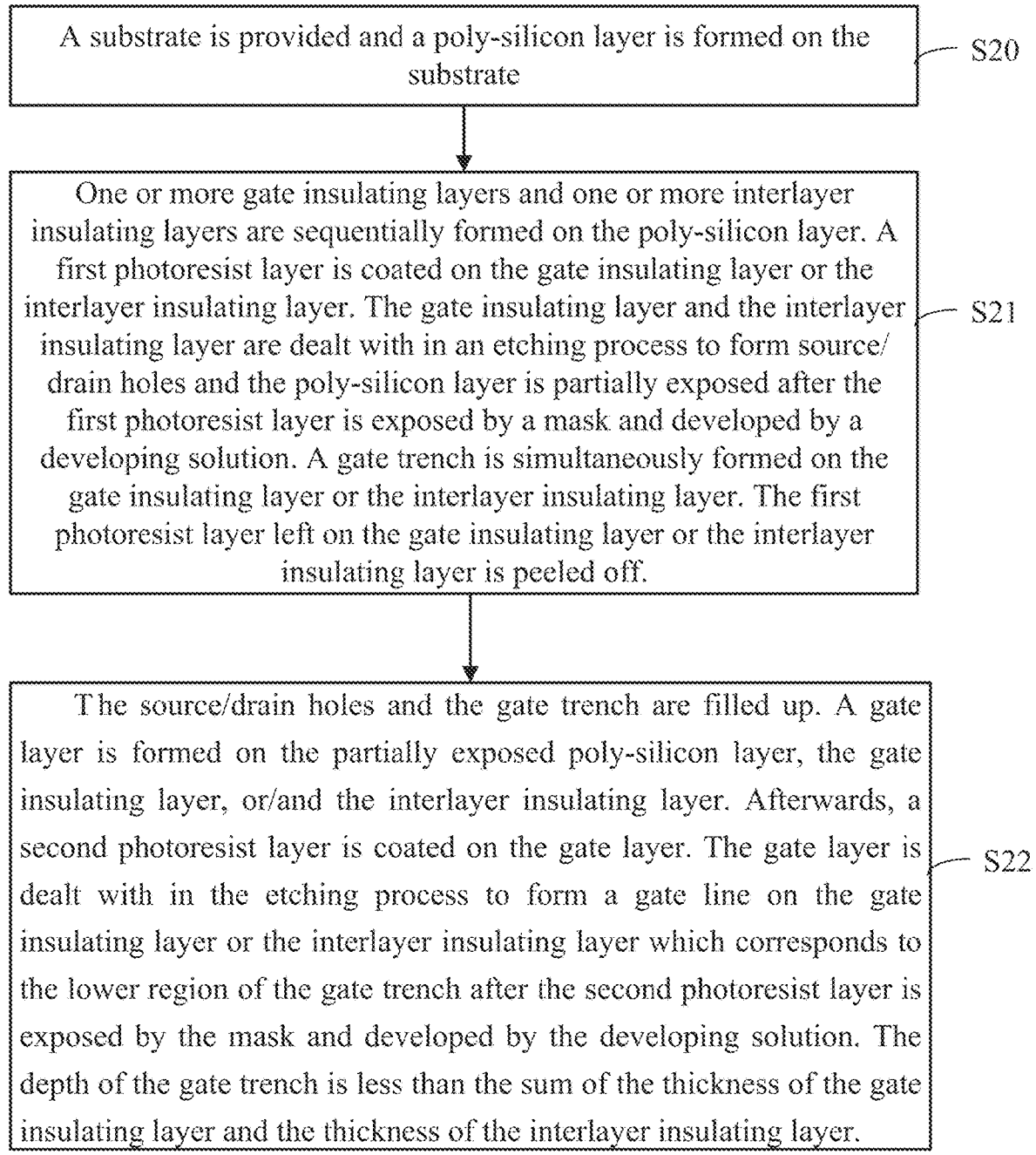
FIG. 3 is a flowchart of a method of producing a low temperature poly-silicon thin film transistor array substrate according to a first embodiment of the present disclosure.

FIG. 3 is a flowchart of a method of producing a low temperature poly-silicon (LTPS) thin film transistor (TFT) array substrate according to a first embodiment of the present disclosure. The method includes block S20, block S21, and block S22.

At block S20, a substrate is provided and a poly-silicon layer is formed on the substrate.

At block S21, one or more gate insulating layers and one or more interlayer insulating layers are sequentially formed on the poly-silicon layer. A first photoresist layer is coated on the gate insulating layer or the interlayer insulating layer. The gate insulating layer and the interlayer insulating layer are dealt with in an etching process to form source/drain holes and the poly-silicon layer is partially exposed after the first photoresist layer is exposed by a mask and developed by a developing solution. A gate trench is simultaneously formed on the gate insulating layer or the interlayer insulating layer. The first photoresist layer left on the gate insulating layer or the interlayer insulating layer is peeled off.

At block S22, the source/drain holes and the gate trench are filled up. A gate layer is formed on the partially exposed poly-silicon layer, the gate insulating layer, or/and the interlayer insulating layer. Afterwards, a second photoresist layer is coated on the gate layer. The gate layer is dealt with in the etching process to form a gate line on the gate insulating layer or the interlayer insulating layer which corresponds to the lower region of the gate trench after the second photoresist layer is exposed by the mask and developed by the developing solution.

The depth of the gate trench is less than the sum of the thickness of the gate insulating layer and the thickness of the interlayer insulating layer.

The present disclosure proposes the method of producing the LTPS TFT array substrate. The method is about stacking of the gate insulating layer and the interlayer insulating layer for providing conditions for formation of the gate trench. In general, the thickness of a gate insulating layer of the related art is merely 0.1 μm (short for micrometer), and the thickness of a gate line of the related art is 0.1 μm or more. When the gate trench is formed on the gate insulating layer and the gate trench is filled up to form the gate line, the thickness of a single-layer gate insulating layer fails to satisfy the requirement for the thickness of the gate trench. In the present disclosure, the stacking of the gate insulating layer and the interlayer insulating layer is produced with some blocks of forming a hole on the gate insulating layer and the interlayer insulating layer to form a hole pattern (source/drain holes and a gate trench), filling up a gate trench, and producing a gate line. In this way, the formation of the gate line and the formation of the hole pattern (the source/drain holes and the gate trench) on the gate insulating layer and the interlayer insulating layer are done using the same mask (the mask utilized on block S21 is the same the mask utilized on block S22). So the number of masks necessary for the LTPS TFT array substrate are reduced. In other words, the production costs are reduced. Compared with the manufacturing process of the related art, the manufacturing process of the LTPS TFT array substrate of the present disclosure omits one mask.

Figure 4:
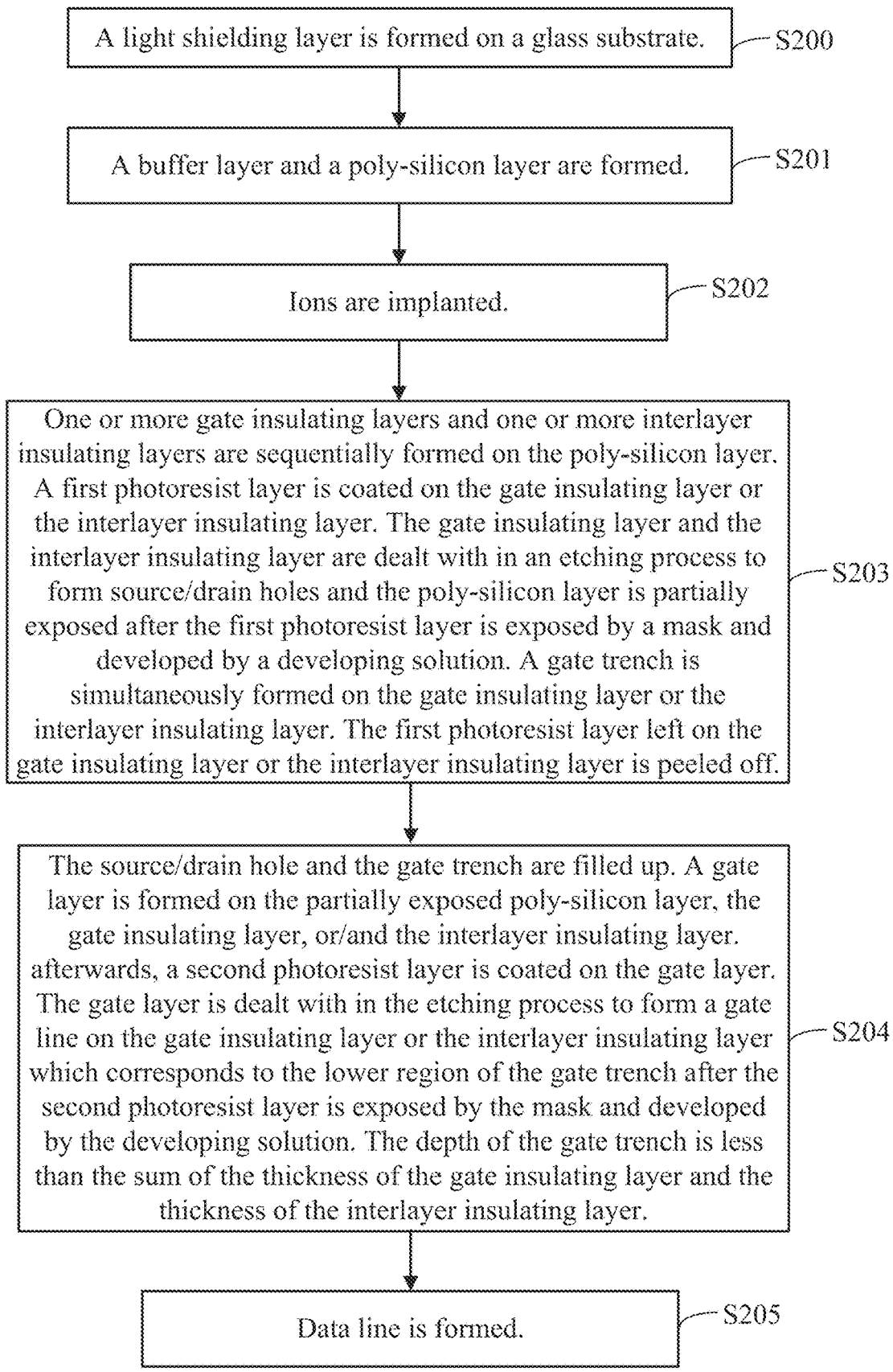
FIG. 4 is a flowchart of production of a low temperature poly-silicon thin film transistor array substrate according to a second embodiment of the present disclosure.

FIG. 4 is a flowchart of production of a low temperature poly-silicon (LTPS) thin film transistor (TFT) array substrate according to a second embodiment of the present disclosure. The LTPS TFT array substrate includes block S200, block S201, block S202, block S203, block S204, and block S205.

At block S200, a substrate is provided. The substrate is a glass substrate, and optionally, a light shielding layer is formed on the glass substrate.

Figure 5A:
FIGS. 5A, 5B, 5C, 5D, 5E, 5F, 5G, 5H, 5I and 5J illustrate the structures of forming the LTPS TFT array substrate under the steps as illustrated in FIG. 4.

Specifically, a glass substrate 200 is provided. A light shielding layer 201 is formed on the glass substrate 200 using a first mask. The light shielding layer 201 is fabricated from metal and functions to block a light beam shining on a semiconductor component in the TFT to prevent the light beam from affecting the process of electron mobility in the semiconductor. After the above-mentioned blocks, a structure as illustrated in FIG. 5A is obtained.

At block S201, a buffer layer and a poly-silicon layer are formed.

Specifically, a buffer layer 202 is optionally formed on the light shielding layer 201 and the glass substrate 200 before a poly-silicon layer 203 is formed. The buffer layer 202 may be a single layer fabricated by an insulating material or may be a stacked structure fabricated by two or more insulating materials. For example, the buffer layer 202 may be a SiNx/SiOx stacked structure formed on the light shielding layer 201 and the glass substrate 200 via a plasma-enhanced chemical vapor deposition (PECVD). The buffer layer 202 is configured to prevent metallic ions (aluminum, germanium, sodium, etc.) in the glass substrate from diffusing into an active region of the LTPS in a thermal process.

Afterwards, the poly-silicon layer is formed on the buffer layer 202 using a second mask. The block of forming the poly-silicon layer 203 includes a block of:

An amorphous silicon (a-Si) layer is formed on the buffer layer 202 via chemical vapor deposition (CVD). The poly-silicon layer 203 is obtained after the a-Si layer 202 is crystallized with the method of eximer laser annealing (ELA).

Figure 5B:
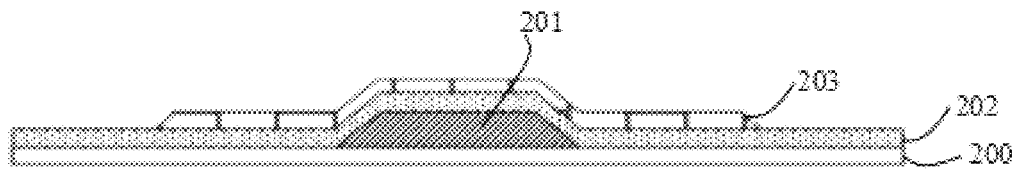

After block S201, a structure as illustrated in FIG. 5B is obtained.

At block S202, ions are implanted.

Specifically, the poly-silicon layer 203 is necessarily patterned to obtain an active layer before the ions are implanted, and then the ions are implanted in the active layer using a third mask.

At block S203, one or more gate insulating layers and one or more interlayer insulating layers are sequentially formed on the poly-silicon layer. A first photoresist layer is coated on the gate insulating layer or the interlayer insulating layer. The gate insulating layer and the interlayer insulating layer are dealt with in an etching process to form source/drain holes and the poly-silicon layer is partially exposed after the first photoresist layer is exposed by a mask and developed by a developing solution. A gate trench is simultaneously formed on the gate insulating layer or the interlayer insulating layer. The first photoresist layer left on the gate insulating layer or the interlayer insulating layer is peeled off.

Specifically, a gate insulating layer 204 and an interlayer insulating layer 206 are sequentially formed on the poly-silicon layer 203 by chemical vapor deposition (CVD). A first gate insulating layer, a first interlayer insulating layer, a second gate insulating layer, and a second interlayer insulating layer form the gate insulating layer 204 and the interlayer insulating layer 206. The first gate insulating layer, the first interlayer insulating layer, the second gate insulating layer, and the second interlayer insulating layer are sequentially stacked on the poly-silicon layer. The thickness of the first gate insulating layer and the thickness of the second gate insulating layer are both about 0.1 μm. The thickness of the first interlayer insulating layer and the thickness of the second interlayer insulating layer both range from 0.4 μm to 0.6 μm. The gate insulating layer is any one of a silicon nitride (SiNx) layer, a silicon oxide (SiOx) layer, and a composite layer of the SiNx layer and the SiOx layer. The interlayer insulating layer is also any one of a silicon nitride layer (SiNx), a silicon oxide layer (SiOx), and a composite layer of the SiNx layer and the SiOx layer. In another embodiment, a first gate insulating layer and a first interlayer insulating layer are both silicon oxide (SiOx) layers, and a second gate insulating layer and a second interlayer insulating layer are both silicon nitride (SiNx) layers. The first gate insulating layer and the first interlayer insulating layer are both SiOx layers and are capable of maintaining heat and oxidation resistance. The second gate insulating layer and the second interlayer insulating layer are SiNx layers and are capable of blocking impurities and improving electrical properties and electrical performance. Such a preferred production method of the gate insulating layer 204 and the interlayer insulating layer 206 cooperates to further improve the overall performance of the LTPS TFT array substrate. In addition, because of the stacked structure of the gate insulating layer and the interlayer insulating layer, the gate insulating layer and the interlayer insulating layer can be obtained using one process. Compared with the method of the related art (the gate insulating layer and the interlayer insulating layer are separately spaced and produced twice), the one-block process of the present embodiment can shorten the overall processing time, thereby improving production efficiency.

Figure 5C:
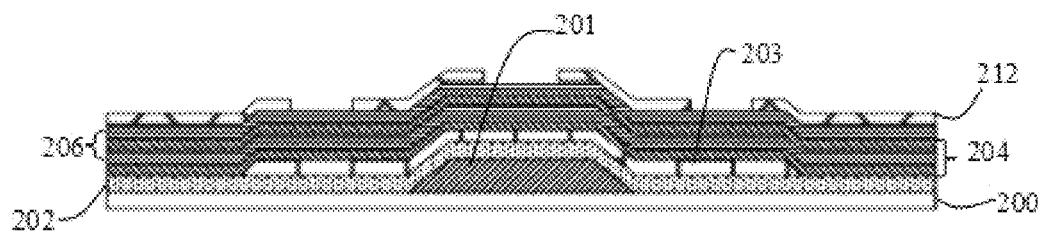
Figure 5D:
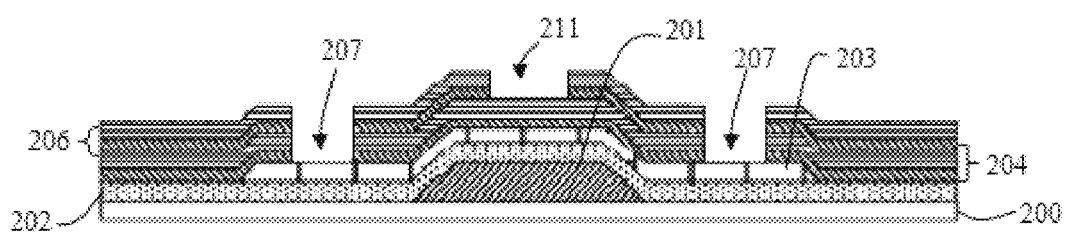

Afterwards, a first negative photoresist layer 212 is coated on the second interlayer insulating layer. After the first negative photoresist layer 212 is exposed using a fourth mask and developed with the developing solution, positioning holes of the source/drain holes and a positioning trench of the gate trench are formed on the first negative photoresist layer 212 (as illustrated in FIG. 5C). Next, the gate insulating layer and the interlayer insulating layer are dealt with in a dry etching process or a wet etching process. Source/drain holes 207 are formed on the gate insulating layer 204 and the interlayer insulating layer 206 corresponding to a lower region of the positioning holes of the source/drain holes, and the poly-silicon layer 203 is partially exposed. At the same time, a gate trench 211 is formed on the first interlayer insulating layer corresponding to a lower region of the positioning trench of the gate trench, and the first negative photoresist layer 212 left on the second interlayer insulating layer is peeled off. After this block, the structure as illustrated in FIG. 5D is obtained.

At block S204, the source/drain hole and the gate trench are filled up. A gate layer is formed on the partially exposed poly-silicon layer, the gate insulating layer, or/and the interlayer insulating layer. Afterwards, a second photoresist layer is coated on the gate layer. The gate layer is dealt with in the etching process to form a gate line on the gate insulating layer or the interlayer insulating layer which corresponds to the lower region of the gate trench after the second photoresist layer is exposed by the mask and developed by the developing solution. The depth of the gate trench is less than the sum of the thickness of the gate insulating layer and the thickness of the interlayer insulating layer.

Figure 5E:
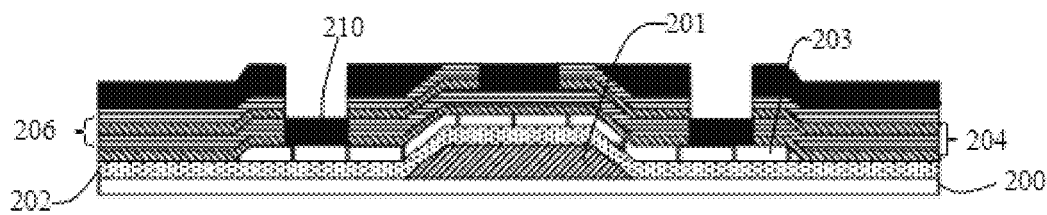
Figure 5F:
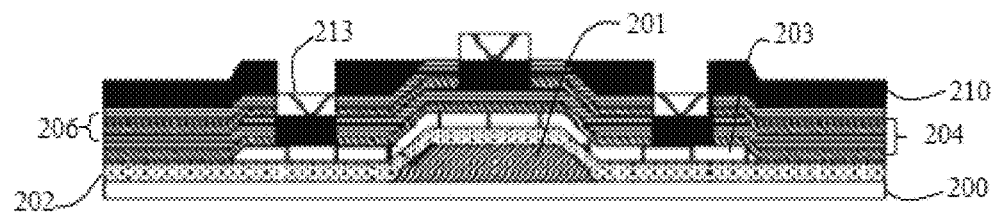
Figure 5G:
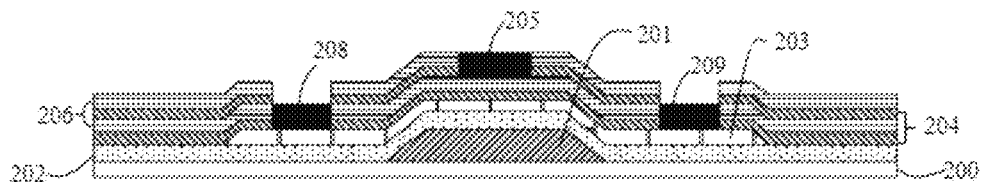

Specifically, the source/drain hole 207 and the gate trench 211 are filled up. The gate layer 210 is formed on the partially exposed poly-silicon layer 203 and the second interlayer insulating layer (as illustrated in FIG. 5E). A first positive photoresist layer 213 is coated on the gate layer 210. After the first positive photoresist layer 213 is exposed through the fourth mask and developed by the developing solution, the first positive photoresist layer 213 is formed to protect the source/drain electrode pattern and the gate line pattern (as illustrated in FIG. 5F). Then, the gate layer 210 which is not protected by the first positive photoresist layer 213 is dealt with in the etching process, and then the first positive photoresist layer 213 left is dealt with. A gate line 205 is formed on the corresponding first interlayer insulating layer corresponding to a lower region of the gate trench 211. At the same time, source and drain electrodes (208, 209) are formed in the source/drain hole 207, and the structure illustrated in FIG. 5G is obtained through this block.

The gate layer is fabricated by one or more conductive materials such as molybdenum, aluminum, copper, and titanium. The thickness of the gate line is the same as the depth of the gate trench. In this way, the accuracy of the gate line is improved by accurately designing the depth of the gate trench. Moreover, the thickness of the gate line is greater than the depth of the gate trench, which increases the difficulty of controlling the etching process. So the thickness of the gate line is the same as the depth of the gate trench, which is advantageous for simplifying the formation of the gate layer and reducing an unnecessary etching process as well.

At block S205, a data line is formed.

Figure 5H:
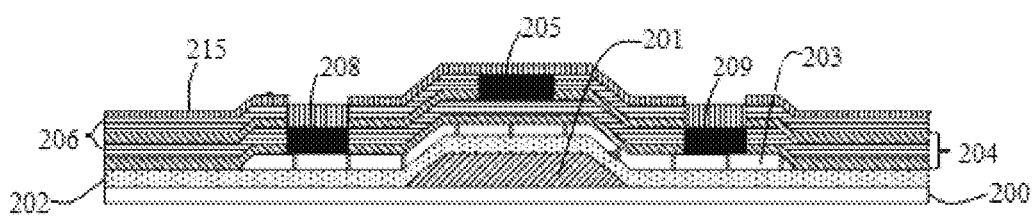

Specifically, a data line layer 215 is formed on the source/drain electrodes (208, 209), the gate line 205, and the second interlayer insulating layer based on physical deposition, as illustrated in FIG. 5H.

Figure 5I:
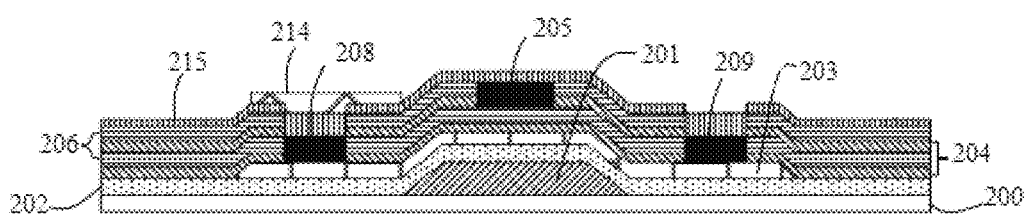
Figure 5J:
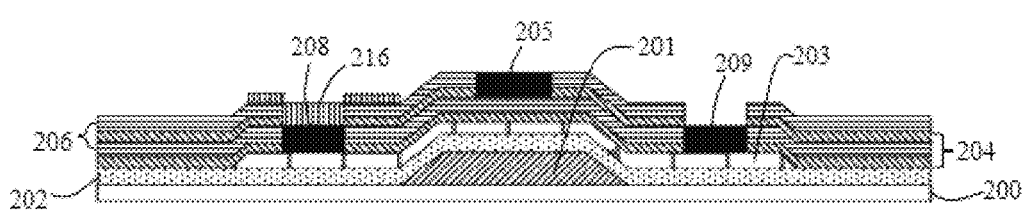

Next, a second positive photoresist layer 214 is coated on the data line layer 215. After the second positive photoresist layer 214 is exposed through a fifth mask and developed with the developing solution, the second positive photoresist layer 214 with a data line pattern is left (as illustrated in FIG. 5I). The other data line layers 215 except the data line pattern are dealt with in the etching process, and the second photoresist layer 214 left is peeled off. The data line 216 is formed on the source, as illustrated in FIG. 5J.

The present disclosure further proposes a low temperature poly-silicon (LTPS) thin film transistor (TFT) array substrate based on the above-mentioned method.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A method of producing a low temperature poly-silicon (LTPS) thin film transistor (TFT) array substrate, comprising:

forming a poly-silicon layer on a substrate;

forming one or more gate insulating layers and one or more interlayer insulating layers sequentially on the poly-silicon layer; coating a first photoresist layer on the gate insulating layer or the interlayer insulating layer; processing the gate insulating layer and the interlayer insulating layer in an etching process to form source/drain holes and exposing the poly-silicon layer partially after the first photoresist layer is exposed by a mask and developed by a developing solution; forming a gate trench simultaneously on the gate insulating layer or the interlayer insulating layer; peeling off the first photoresist layer left on the gate insulating layer or the interlayer insulating layer;

filling up the source/drain hole and the gate trench; forming a gate layer on the partially exposed poly-silicon layer, the gate insulating layer, or/and the interlayer insulating layer; coating a second photoresist layer on the gate layer; processing the gate layer in the etching process to form a gate line on the gate insulating layer or the interlayer insulating layer which corresponds to a lower region of the gate trench after the second photoresist layer is exposed by the mask and developed by the developing solution;

wherein the depth of the gate trench is less than the sum of the thickness of the gate insulating layer and the thickness of the interlayer insulating layer.

2. The method of claim 1, wherein the step of forming the one or more gate insulating layers and the one or more interlayer insulating layers sequentially on the poly-silicon layer comprises a block of forming the gate insulating layer and the interlayer insulating layer at once by chemical vapor deposition (CVD).

3. The method of claim 1, wherein the gate insulating layer is any one of a silicon nitride (SiNx) layer, a silicon oxide (SiOx) layer, and a composite layer of the SiOx layer and the SiNx layer; the interlayer insulating layer is any one of the SiNx layer, the SiOx layer, and the composite layer of the SiOx layer and the SiNx layer.

4. The method of claim 1, wherein the step of forming the one or more gate insulating layers and the one or more interlayer insulating layers sequentially on the poly-silicon layer comprises a block of forming a first gate insulating layer, a first interlayer insulating layer, a second gate insulating layer, and a second interlayer insulating layer sequentially on the poly-silicon layer; the first gate insulating layer and the first interlayer insulating layer are both the $SiO_x$ layers; the second gate insulating layer and the second interlayer insulating layer are the $SiN_x$ layers.

5. The method of claim 1, wherein the thickness of the gate line is the same as the depth of the gate trench.

6. The method of claim 1, wherein the gate trench is obtained after the gate insulating layer and the interlayer insulating layer are dealt with in a dry etching process or a wet etching process.

7. The method of claim 1, wherein the gate layer is made by one of materials consisting of molybdenum, aluminum, copper, and titanium.

8. The method of claim 1, wherein before the step of forming the poly-silicon layer on the substrate, the method of producing the LTPS TFT array substrate further comprises a block of forming a buffer layer on the substrate via a plasma-enhanced chemical vapor deposition (PECVD).

9. The method of claim 1, wherein before the step of forming the poly-silicon layer on the substrate, the method of producing the LTPS TFT array substrate further comprises a block of forming a light shielding layer on the substrate.

10. The method of claim 1, further comprising: forming a data line on a source electrode, wherein the source electrode and the gate line are produced in the same process.

\* \* \* \* \*